United States Patent [19]
Roberts

[11] 3,909,321
[45] Sept. 30, 1975

[54] CONTROL OF DIFFUSION PROFILES IN A THYRISTOR BY A GROWN OXIDE LAYER

[75] Inventor: Gary I. Roberts, Mountain View, Calif.

[73] Assignee: International Rectifier Corporation, Los Angeles, Calif.

[22] Filed: Nov. 5, 1973

[21] Appl. No.: 413,044

[52] U.S. Cl. ................. 148/190; 148/1.5; 148/189; 148/187; 148/191; 357/38
[51] Int. Cl.² ........................................... H01L 7/44
[58] Field of Search ............ 148/1.5, 190, 191, 189, 148/187

[56] References Cited
UNITED STATES PATENTS

| | | | |
|---|---|---|---|
| 2,953,486 | 9/1960 | Atalla | 148/191 |
| 3,085,033 | 4/1963 | Handelman | 148/191 |
| 3,795,554 | 3/1974 | Tarn | 148/189 |

*Primary Examiner*—G. Ozaki
*Attorney, Agent, or Firm*—Ostrolenk, Faber, Gerb & Soffen

[57] ABSTRACT

The impurity concentration profile of a device formed by the simultaneous closed tube diffusion of Group III-V intermetallics is controlled by depositing an oxide surface on the diffused device and by applying an open tube drive diffusion step. The added diffusion step will cause a redistribution of the Group III and Group V impurities and the oxidation of the surface will remove surface layer portions of the wafer which may have been damaged by mechanical lapping of the wafer prior to the initial diffusion step.

6 Claims, 11 Drawing Figures

CONTROL OF DIFFUSION PROFILES IN A THYRISTOR BY A GROWN OXIDE LAYER

BACKGROUND OF THE INVENTION

This invention relates to a novel process for forming a plurality of junctions in a semiconductor wafer by simultaneous diffusion of Group III and V impurities, and more specifically relates to a process for removing damaged surface layers from a Group III-V diffused wafer and for redistributing the Group III and Group V impurity concentrations within the wafer.

The formation of a plurality of P-N junctions by a single diffusion step, using Group III-V diffusion sources is well known, and is described, for example, in copending application Ser. No. 316,870, filed Dec. 20, 1972, now U.S. Pat. 3,795,554, and assigned to the assignee of the present invention. The above application discloses simultaneous closed tube diffusion of Group III–V intermetallic compounds into semiconductor wafers. This provides a means of obtaining two or more diffused junctions in the wafers since the diffusion coefficients and solid solubilities of the two chosen impurity elements in the semiconductor are not the same. The diffusion profiles of the Group III and V elements can then be varied somewhat by adjusting the temperature of diffusion, diffusion time, and the partial pressures of these elements in the closed tube.

BRIEF SUMMARY OF THE INVENTION

The present invention provides a novel method for the further control of the impurity profiles and depths of a plurality of P-N junctions in a semiconductor wafer. In particular, and after the Group III and V impurities are diffused into the wafer, an added open tube drive diffusion step is applied to the wafer. An oxide surface is grown on the wafer surface during all or a portion of this open tube drive diffusion. The oxide will absorb Group III impurities out of the semiconductor and reject or "pile up" Group V impurities at the growth surface. The growth time, temperature and thickness of the oxide will affect the amount of decrease of the Group III element surface concentration and the increase in the Group V element surface concentration. A more shallow Group III profile and a more abrupt Group V profile is also obtained.

When applied specifically to thyristor type devices, the control of the Group III-V impurities as above causes increased emitter efficiency, higher blocking voltage, faster turn-on (due to faster plasma spread in the P-type base region), and increased resistance to dv/dt firing.

As a further feature of the invention, it was found that, by oxidizing the wafer surface, all or a portion of the surface layer which was damaged by mechanical lapping is removed. That is, it is customary to lap semiconductor wafers to a specified thickness required for a particular device prior to diffusion processing. This leaves a damaged layer on the surface of the semiconductor which aids in diffusion of the Group III and V impurity species. By oxidizing the surface of the semiconductor, all or a portion of this damaged layer may be removed (the silicon in the damaged layer being taken up into the silicon dioxide layer). The impurity concentration profile, surface concentration and junction depth can then be made a function of the amount of damaged surface layer removed (i.e. a function of the oxide thickness). By removing this layer by oxidation, less contamination and a finer control of layer thickness can be achieved compared with chemically removing this layer. For thyristor application, device junction depths, impurity profiles and surface concentrations and thus thyristor electrical characteristics can be more finely controlled.

It is to be noted that it is known that Group III impurities will diffuse out of a semiconductor wafer and into an oxide layer which is thermally formed on a wafer surface, as disclosed in U.S. Pat. Nos. 3,320,103 and 3,573,113. However, this out-diffusion is always carried out only in connection with a single P-N junction, rather than for a plurality of P-N junctions in connection with a combined Group III–V diffusion process.

DETAILED DESCRIPTION OF THE DRAWINGS

Figure 1:
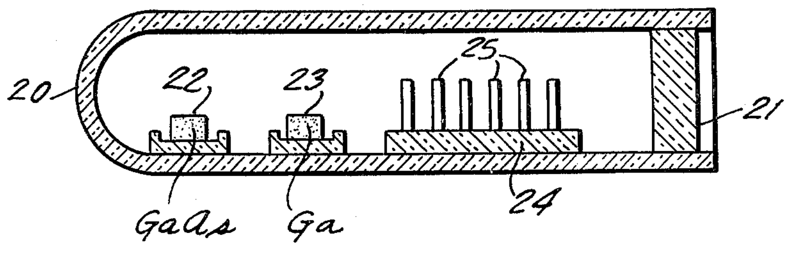
FIG. 1 schematically illustrates in cross-section a sealed diffusion vessel containing a Group III–V intermetallic compound; a Group III pure metal; and a boat of semiconductor wafers which are to be diffused.

Referring now to the drawings, FIG. 1 illustrates in cross-sectional view, and in a schematic fashion, the apparatus described in copending application Ser. No. 316,870, now U.S. Pat. No. 3,795,554, for the simultaneous Group III–V diffusion of a semiconductor wafer. Thus, a diffusion vessel 20 is sealed with a quartz plug 21 and has loaded therein a Group III–V intermetallic compound source 22, and a corresponding pure metal source 23. The pure metal source 23 will usually be of the same metal as the Group III metal in the intermetallic compound 22. A conventional boat 24, carrying a plurality of spaced silicon wafers 25, is then loaded within the chamber 20. Wafers 25 conventionally will be monocrystalline silicon wafers which have been prepared, as will be described hereinafter in connection with FIGS. 2 to 5, before they are loaded into the chamber 20.

The Group III-V intermetallic compound 22 is preferably gallium arsenide in the pure stoichiometric form and the metal 23 is preferably gallium. Alternatively, the Group III–V metal 22 can be gallium phosphide or gallium antimonide. In these cases, pure gallium metal would also be used for the metal 23. As a further example, aluminum antimonide can be used for the Group III–V metal where Group III aluminum would be used for the metal 23.

Figure 3:
FIG. 3 is a cross-sectional view of FIG. 2 taken across the section line 3—3 in FIG. 2.
Figure 2:
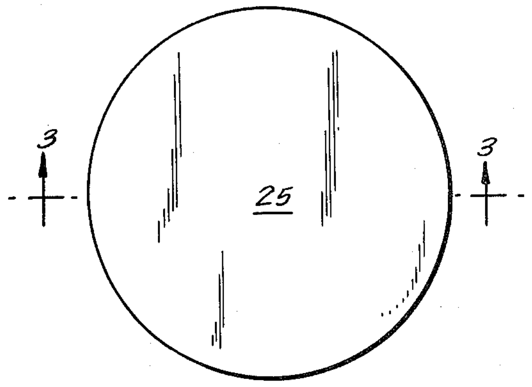
FIG. 2 is a top view of a typical wafer which could be loaded into the diffusion chamber of FIG. 1.
Figure 4:
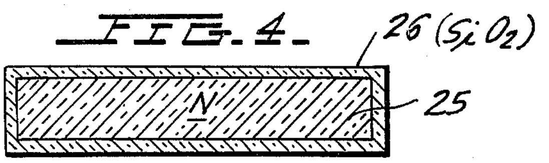
FIG. 4 shows the wafer of FIG. 3 after the formation of a silicon dioxide coating therein.

In preparing the wafers 25 for diffusion, an N-type wafer is prepared as shown in FIGS. 2 and 3 which, conventionally, can have a diameter between 0.7 and 1.300 inches and a thickness between 8.0 and 15.0 mils. The wafer may have a resistivity between 15 and 300 ohm centimeters.

The first step in the process is to form a silicon dioxide coating 26 on the wafer 25 through any of the conventional processes. For example, the wafer can be heated to a furnace temperature of about 1,200°C in an ambient atmosphere of oxygen gas and steam for a given length of time. In the particular example set forth to produce a particular thyristor, the silicon dioxide coating will be 0.01 to 0.20 mils thick.

Figure 5:
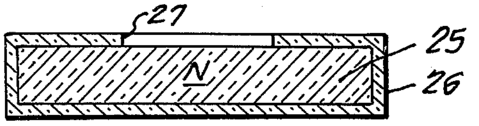
FIG. 5 shows the wafer of FIG. 4 after a single window is formed in the wafer preparatory to the manufacture of a thyristor device.

In order to produce a thyristor device, and as shown in FIG. 5, a circular window 27 is formed in the silicon dioxide coating 26 by conventional photoresist and etching techniques to expose the bare surface of the wafer 25 through the window 27. Wafers of the form shown in FIG. 5 are then cleaned and loaded into the boat 24 of FIG. 1, and are placed in the diffusion chamber 20.

The chamber 20 is suitably and conventionally prepared and is back-filled with a suitable inert gas such as argon, for example, at 270 millimeters absolute pressure. The purpose of the gas is to keep the tube 20 from collapsing under the extremely high diffusion temperatures, and further serves to maintain a clean and inert atmosphere for the diffusion process. At the same time, a Group III-V intermetallic compound 22, preferably gallium arsenide and a pure mass of metallic gallium, is loaded into the diffusion vessel 20. By way of example, where 200 wafers are to be simultaneously diffused, good results have been obtained using 1.4 grams of gallium arsenide and 0.6 grams of gallium.

As pointed out previously, other Group III-V intermetallic compounds and other pure metals could be loaded into the tube in place of gallium arsenide and pure gallium.

Thereafter, the temperature within vessel 20 is raised, with a typical diffusion process lasting about 40 hours at 1,237°C. Diffusion will then proceed from the gallium and arsenic atmosphere surrounding the wafers 25 such that the P-type gallium impurity atoms will diffuse faster than the N-type arsenic impurity atoms and moreover, such that the P-type gallium will penetrate the silicon dioxide mask 26 easily, whereas the N-type arsenic will not penetrate mask 26.

In choosing the particular intermetallic compound to be used, it is, therefore, necessary that the two impurity atoms will have unique diffusion coefficients at the diffusion temperature. Moreover, the two different impurities should have unique solubility limits and diffusion velocities in the silicon dioxide layer used as a diffusion mask. Thus, by selecting different silicon dioxide thicknesses, it is possible to delay or exclude the arrival of certain impurity atoms at the silicon surface.

Figure 6:
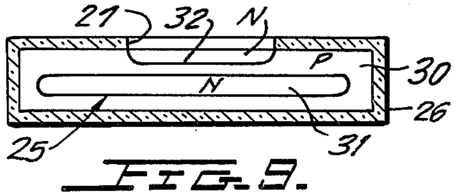
FIG. 6 illustrates the formation of junctions in the wafer of FIG. 5 after diffusion in the chamber of FIG. 1.

FIG. 6 illustrates the diffusion pattern and junctions which are formed in the wafer of FIG. 5, where it is seen that a P-type shell 30 is formed which surrounds the N-type core 31 within the wafer. An N-type region 32 is formed beneath the window 27. The P-type shell 30 is formed by gallium impurity atoms which penetrated the silicon dioxide layer 26 to the depth of the N-type core region 31. The outer surface of the P-type region will have a sheet resistance at its surface of about 10 ohms per square in the example herein. The N-type region 32, formed within the window 27, is formed since the arsenic atoms are able to reach the silicon surface exposed by window 27. The region is N-type since the P-type gallium atoms diffuse much more rapidly than the N-type arsenic atoms and because the arsenic concentration is much geater than the gallium concentration at the surface. Thus, the region 32 remains N type, with its surface having a sheet resistance of about 0.4 ohms per square at the end of the diffusion cycle.

It will be noted that the simultaneous diffusion of the Group III–V intermetallic compound, when modified in concentration by a pure metal such as a Group III metal, permits a wide latitude in selection of desired junction depths, distribution of impurity regions and impurity gradient distributions by control of the following variables:

1. The weight of the intermetallic source 22;
2. the weight of the gallium sump source 23;
3. diffusion temperature;
4. time at diffusion temperature;
5. location and temperature of the impurities in the sealed diffusion tube.

Good results were obtained with the ratio of gallium arsenide to pure gallium in the sealed tube of FIG. 1 being approximately 2 to 1 by weight. In the process described above, the N-type region 32 will have a depth of about 1 mil while the P-type shell 30 has a depth of about 2.2 mils around the entire surface of the device.

Figure 8:
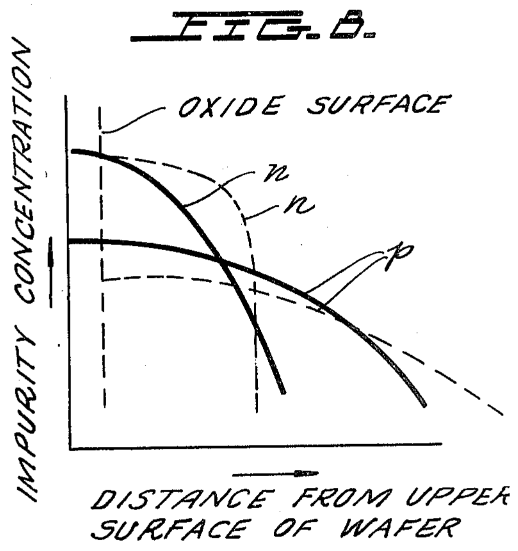
FIG. 8 shows the impurity concentrations of the Group III and Group V impurities both before and after the open tube drive diffusion step on the wafer of FIG. 7.

In accordance with the present invention, the diffused wafers of FIG. 6 are removed from the diffusion chamber of FIG. 1, stripped of the oxide layer 26 by dipping the wafers in hydrofluoric acid, and are placed in an open-tube diffusion chamber. They are then exposed to a flow of steam in order to grow the silicon dioxide layer 39 over the silicon surface. Typically, layer 39 is grown to a thickness of about 0.12 mils. The diffusion chamber is heated to a temperature of about 1,200°C for about 60 hours so that the Group III and Group V impurities will redistribute generally as shown in FIG. 8 where the solid line shows the impurity concentrations before the open-tube diffusion, while the dotted lines show the impurity concentrations after the open-tube drive diffusion. The oxidation portion of this "drive diffusion" lasts, typically, for the first 10 hours. During the remaining 50 hours, the wafers are diffused in a neutral ambient such as dry nitrogen gas. Layer 39 could have a thickness of from 0.08 mils to 0.14 mils and could have been formed by heating the wafer for from 5 to 80 hours at from 1,000°C to 1,300°C.

Figure 7:
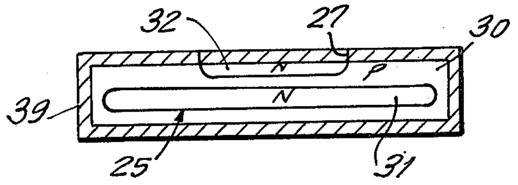
FIG. 7 shows the wafer of FIG. 6 after an oxide coating is grown over the full wafer surface, and after an open tube diffusion process has been carried out, in accordance with the invention.
Figure 9:
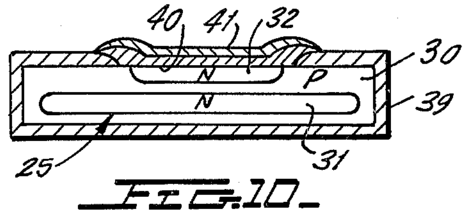
FIG. 9 illustrates the wafer of FIG. 7 after the formation of conductive layers on what is to become the cathode surface.

In order to complete the wafer for use as a thyristor the diffused wafers of FIG. 7 are removed from the open-tube diffusion chamber and are suitably cleaned. Thereafter, and as shown in FIG. 9, the wafers are plated, first with a nickel layer 40 and then with a gold layer 41 over the exposed window region 27. More specifically, in cleaning the wafer of FIG. 7, the wafer is suitably etched so that the window 27 is exposed and slightly undercut to expose the region at which the boundary of the N-type material 32 intersects the upper surface of the wafer.

A lower nickel layer 40 is then applied by a conventional electroless plating process, where the nickel adheres only to the exposed silicon surface, but not to the silicon dioxide coating 39. The nickel layer 40 is then followed by a gold plating layer 41 which adheres only to the nickel layer 40. Note that nickel layer 40 and gold plating layer 41 extend slightly across the edge of the junction defined between N-type region 32 and P-type region 30 to serve as a shorted emitter connection in the completed device.

Figure 10:
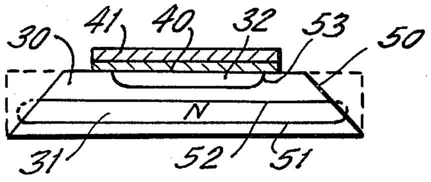
FIG. 10 shows the wafer of FIG. 9 after tapering the wafer periphery to define isolated junctions.

The wafer of FIG. 9 is then exposed to a sandblast in which the periphery of the wafer is sandblasted to the conical shape 50, where the sandblasting operation serves to sever the edges of N-type region 31, thereby to define two isolated junctions 51 and 52 for the device as in FIG. 10. These operate in connection with the further junction 53 to form a conventional controlled rectifier configuration.

Figure 11:
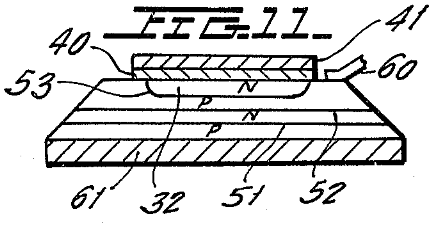
FIG. 11 shows the wafer of FIG. 10 after the addition of gate and anode electrodes, with the device now ready for insertion into a suitable package.

The device is then completed as shown in FIG. 11 by the addition of an aluminum gate lead 60 and a molybdenum or tungsten anode electrode 61 of conventional type. The completed wafer sandwich is then ready for insertion into a suitable package.

Although there has been described a preferred embodiment of this novel invention, many variations and modifications will now be apparent to those skilled in the art. Therefore, this invention is to be limited, not by the specific disclosure herein, but only by the appended claims.

I claim:

1. The process of forming a plurality of spaced P-N junctions in a monocrystalline silicon wafer; said process comprising the steps of:

forming a diffusion mask on the outer surface of said silicon wafer, forming at least one window in said diffusion mask, loading said wafer into a diffusion furnace and loading a measured mass of a Group III-V intermetallic compound and a measured mass of a pure metal selected from the group consisting of Group III and Group V metals into said diffusion furnace, heating said diffusion furnace to a diffusion temperature and forming, in a single diffusion cycle, a P-type region in said wafer beneath said diffusion mask and an N-type region in regions of said wafer exposed to said mask with the junction between said P-type and N-type regions extending to and terminating on said outer surface of said wafer, and thereafter stripping and redepositing an oxide coating over the entire wafer, and raising the temperature of said wafer, thereby to vary the impurity concentration of both Group III and V impurities within the wafer.

2. The process of claim 1 wherein said diffusion mask consists of a layer of silicon dioxide.

3. The process of claim 1 wherein said window is formed adjacent one surface of said wafer.

4. The process of claim 1 wherein said Group III–V intermetallic compound is gallium arsenide and wherein said Group III metal is pure gallium.

5. The process of claim 1 wherein said diffusion furnace is sealed and is filled with an inert gas.

6. The process of claim 1 wherein said silicon wafer is of the N-type conductivity before diffusion.

* * * * *